United States Patent [19]

Swain et al.

[11] Patent Number: 5,755,473
[45] Date of Patent: May 26, 1998

[54] SUBSTRATE CARRIER SYSTEM

[75] Inventors: Eugene A. Swain, Webster; Thomas E. Smith, Hamlin; Alan D. Smith, Henrietta; Robert S. Foltz, Rochester; Peter J. Schmitt, Ontario; Stanley J. Pietrzykowski, Jr., Rochester; Kamran U. Zaman, Pittsford, all of N.Y.

[73] Assignee: Xerox Corporation, Stamford, Conn.

[21] Appl. No.: 695,044

[22] Filed: Aug. 9, 1996

[51] Int. Cl.$^6$ .................................... B66C 1/56
[52] U.S. Cl. .................... 294/87.1; 118/503; 294/93
[58] Field of Search .................. 294/81.1, 81.5, 294/81.6, 87.1, 87.11, 93, 94, 98.1; 118/500, 503; 269/48.1, 48.2; 279/2.17, 137; 414/736, 751

[56] References Cited

U.S. PATENT DOCUMENTS

| | | | |
|---|---|---|---|
| 2,611,612 | 9/1952 | Schmidt | 294/87.1 X |
| 2,863,579 | 12/1958 | Meyer | 294/87.1 X |
| 3,347,587 | 10/1967 | Frost | 294/87.1 |
| 3,453,989 | 7/1969 | Bippus | 294/87.1 X |
| 4,651,400 | 3/1987 | Shields | 297/87.1 X |
| 5,282,888 | 2/1994 | Fukawa et al. | 118/500 |
| 5,320,364 | 6/1994 | Mistrater et al. | 279/2.17 |
| 5,322,300 | 6/1994 | Mistrater et al. | 279/2.17 |
| 5,324,049 | 6/1994 | Mistrater et al. | 279/2.17 |
| 5,328,181 | 7/1994 | Mistrater et al. | 279/2.17 |
| 5,334,246 | 8/1994 | Pietrzykowski, Jr. et al. | 118/69 |

*Primary Examiner*—Johnny D. Cherry
*Attorney, Agent, or Firm*—Zosan S. Soong

[57] ABSTRACT

There is disclosed a carrier system for carrying a substrate batch including:

(a) a heat treated, integral pallet having a pallet thickness, a top surface, and a bottom surface, wherein the pallet defines a plurality of passageways extending completely through the pallet thickness to form a first plurality of openings on the top surface and the bottom surface, wherein the pallet also defines a plurality of chambers extending through at least a portion of the pallet thickness to form a second plurality of openings on the bottom surface; and (b) a plurality of chuck assemblies partially disposed in the plurality of chambers and adapted to engage the substrate batch, wherein the pallet has sufficient structural rigidity such that while the carrier system is carrying the substrate batch, even when the carrier system is subjected to an elevated temperature, there is absent any appreciable bending and twisting of the pallet.

11 Claims, 5 Drawing Sheets

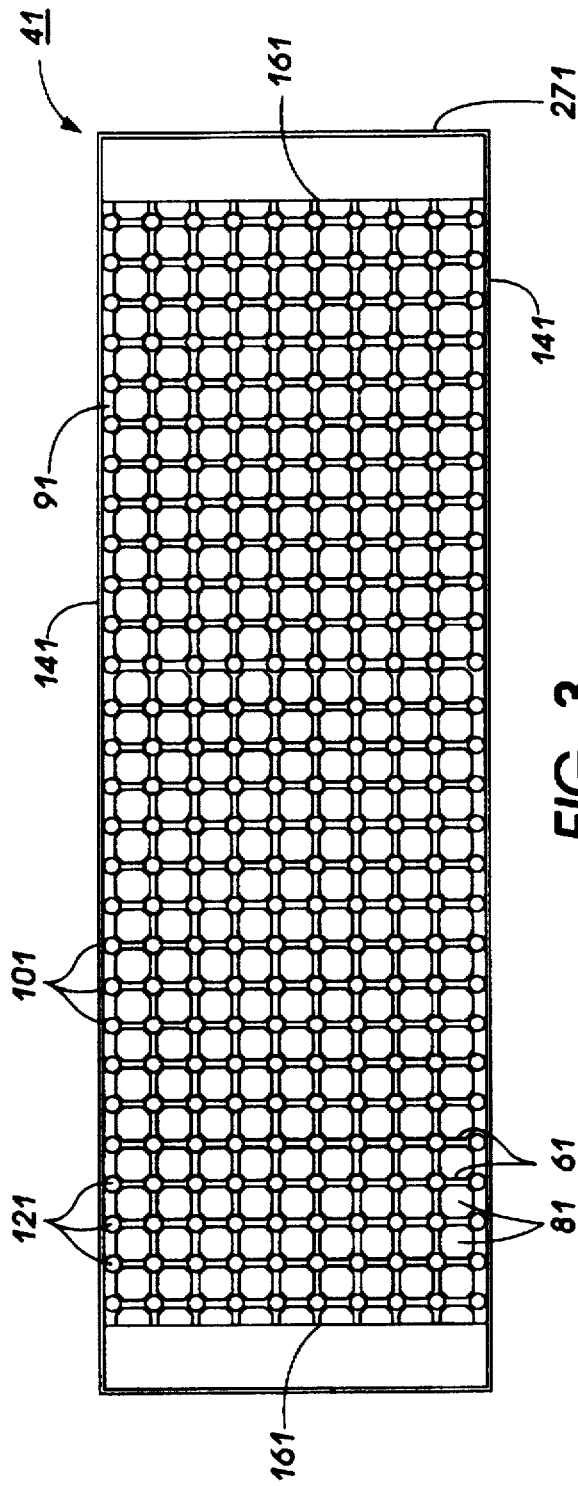
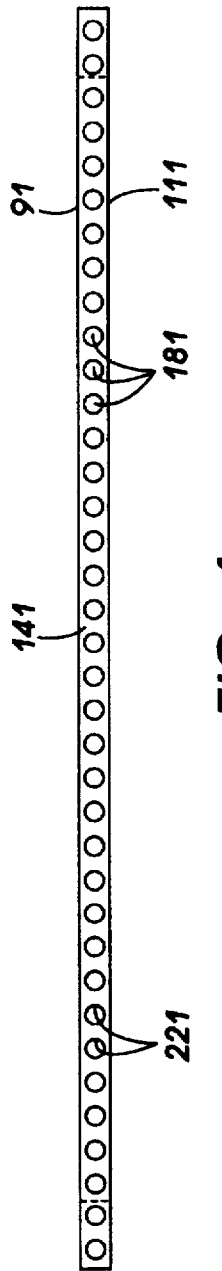
FIG. 3
FIG. 4

SUBSTRATE CARRIER SYSTEM

BACKGROUND OF THE INVENTION

This invention relates to a carrier system for carrying a substrate batch wherein the carrier system may be part of a substrate handling system for use in for instance a dip coating process system. The dip coating process system may be used in manufacturing a plurality of multi-layer photosensitive members (also referred herein as photoreceptors) in a continuous in-line configuration.

To reduce the manufacturing costs of photoreceptors, larger batch sizes are desirable. A major challenge of increasing the batch size is selecting the appropriate configuration for the carrier system. The carrier system should be relatively inexpensive as well as having one or more of the following characteristics: lightweight for minimal heat sinking; strong and rigid for precise positioning of the coupled substrate batch in a processing station and repeatability of the precise positioning of the substrate batch; open structure for improved air flow through the pallet which is important when there is a need for rapid cooling or heating of the substrate batch; clean room compatibility (i.e., must not contaminate the coatings on the substrate batch); and high temperature dimensional stability. Thus, there is a need, which the present invention addresses, for a carrier system that meets the above described characteristics.

Conventional chuck assemblies are disclosed in Fukawa et al., U.S. Pat. No. 5,282,888; Mistrater et al., U.S. Pat. No. 5,322,300; Mistrater et al., U.S. Pat. No. 5,328,181; Mistrater et al., U.S. Pat. No. 5,320,364; and Mistrater et al., U.S. Pat. No. 5,324,049.

The chuck assembly illustrated in FIGS. 1-2 of the present application is disclosed in a copending application, U.S. Pat. No. 08/692,108 filed Aug. 5, 1996, (attorney docket no. D/96155) titled "CHUCK ASSEMBLY HAVING A PULL UP FEATURE" and having the inventors Peter J. Schmitt et al.

A conventional dip coat process material handling system is described in Pietrzykowski, Jr. et al., U.S. Pat. No. 5,334,246.

SUMMARY OF THE INVENTION

The present invention is accomplished in embodiments by providing a carrier system for carrying a substrate batch comprising:

(a) a heat treated, integral pallet having a pallet thickness, a top surface, and a bottom surface, wherein the pallet defines a plurality of passageways extending completely through the pallet thickness to form a first plurality of openings on the top surface and the bottom surface, wherein the pallet also defines a plurality of chambers extending through at least a portion of the pallet thickness to form a second plurality of openings on the bottom surface; and (b) a plurality of chuck assemblies partially disposed in the plurality of the chambers and adapted to engage the substrate batch, wherein the pallet has sufficient structural rigidity such that while the carrier system is carrying the substrate batch, even when the carrier system is subjected to an elevated temperature, there is absent any appreciable bending and twisting of the pallet.

BRIEF DESCRIPTION OF THE DRAWINGS

Other aspects of the present invention will become apparent as the following description proceeds and upon reference to the Figures which represent preferred embodiments:

FIG. 3 represents a schematic top view of one embodiment of the pallet (the bottom view is similar to the bottom view);

FIG. 4 represents a schematic side view of the pallet of FIG. 3;

Unless otherwise noted, the same reference numeral in different Figures refers to the same or similar feature.

DETAILED DESCRIPTION

Figure 1:
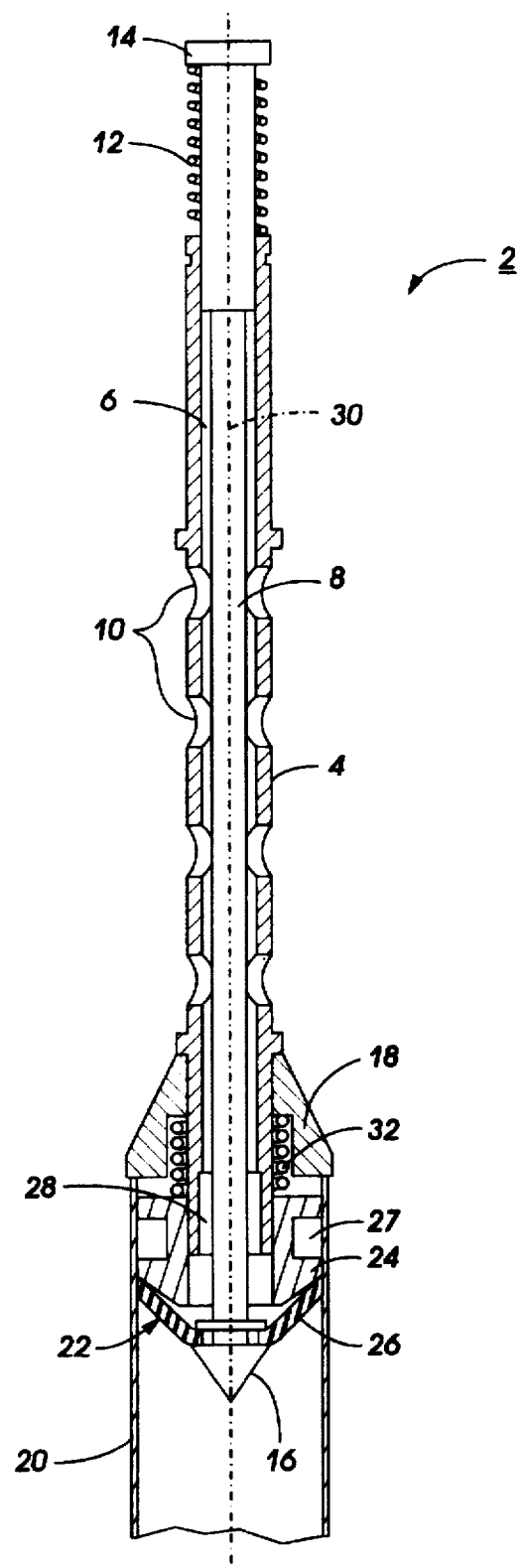
FIG. 1 represents a schematic side cross-sectional view of one embodiment of a chuck assembly.

FIG. 1 depicts a preferred chuck assembly 2 including a body 4 defining a passageway 6, a width changing apparatus 8 in the form of for example a vertically moveable rod disposed in the passageway along the length of the body. The body may define a plurality of holes 10 to reduce weight. The width changing apparatus 8 is spring loaded via a spring 12 and a top cap 14. A nose piece 16 is coupled to one end of the width changing apparatus. The body 4 includes an alignment shoulder 18 which serves to act as a stop for a substrate 20. The end portion 22 includes a wedge 24 and a polymeric member 26 that has a changeable width. The polymeric member is coupled, via a recess machined into the nosepiece, to the width changing apparatus 8 and rests against the wedge 24. The wedge defines a groove 27 (the purpose of the groove 27 is for mass reduction) and is operatively coupled to a spring 32 which may be a flat spring. A bushing 28 positions the width changing apparatus 8 within the end portion 22. The alignment shoulder 18 and the end portion 22 are positioned on the longitudinal axis 30 of the chuck assembly, where the alignment shoulder is positioned above the end portion.

Operation of the chuck assembly depicted in FIG. 1 proceeds as follows. The width changing apparatus 8 is depressed downwards via pressure on top cap 14, which moves the polymeric member 26 downwards away from the alignment shoulder 18 along the longitudinal axis 30, which stretches the polymeric member downwards, and which may lift a part of the polymeric member slightly off the wedge 24, thereby decreasing the width of the polymeric member. In the present invention, the polymeric member can move along the longitudinal axis; mere stretching of the walls of the polymeric member is not considered movement for the purposes of the present invention. Thus, in embodiments, the entire polymeric member can move down and then up along the longitudinal axis. During the movement of the polymeric member downwards, the spring 32 also pushes the wedge downwards away from the alignment shoulder. When the width of the polymeric member is decreased, the end portion 22 may be inserted into the substrate 20. When the end of the substrate is close to or at the alignment shoulder, the pressure on the end cap is reduced or eliminated and the width changing apparatus 8 moves upward. Upward movement of the width changing apparatus in the direction of the alignment shoulder reduces the downward force on the polymeric member which increases the width of the polymeric member, allows engagement of the edge of the polymeric member with the substrate inner surface, and pulls the substrate towards the alignment shoulder due to the upward movement of the polymeric member and the wedge towards the alignment shoulder. Preferably, the engagement of the polymeric member with the substrate inner surface and the pulling up of the substrate by the upward movement of the engaged polymeric member occur substantially simultaneously. After processing of the substrate, the width changing apparatus is depressed to shrink the width of the polymeric member, thereby allowing withdrawal of the chuck assembly from the substrate.

Thus, in embodiments, the end portion is moveable from an initial position adjacent the alignment shoulder to a position spaced apart from the alignment shoulder and back to the initial position adjacent the alignment shoulder. The polymeric member is adapted to move for a length ranging for example from about 3 mm to about 2 cm along the longitudinal axis. The polymeric member pulls the substrate along the longitudinal axis for a distance ranging for example from about 3 mm to about 2 cm towards the alignment shoulder. Preferably, the pulling action of the polymeric member on the substrate seats the end of the substrate against the alignment shoulder. In preferred embodiments, the chuck assembly can pull up the substrate even when the other end of the substrate is unsupported.

During engagement of the chuck assembly with the substrate, it is preferred that a hermetic seal is created by contact of the polymeric member against the substrate inner surface to minimize or prevent fluid migration, especially liquid, into the interior of the substrate.

Figure 2:
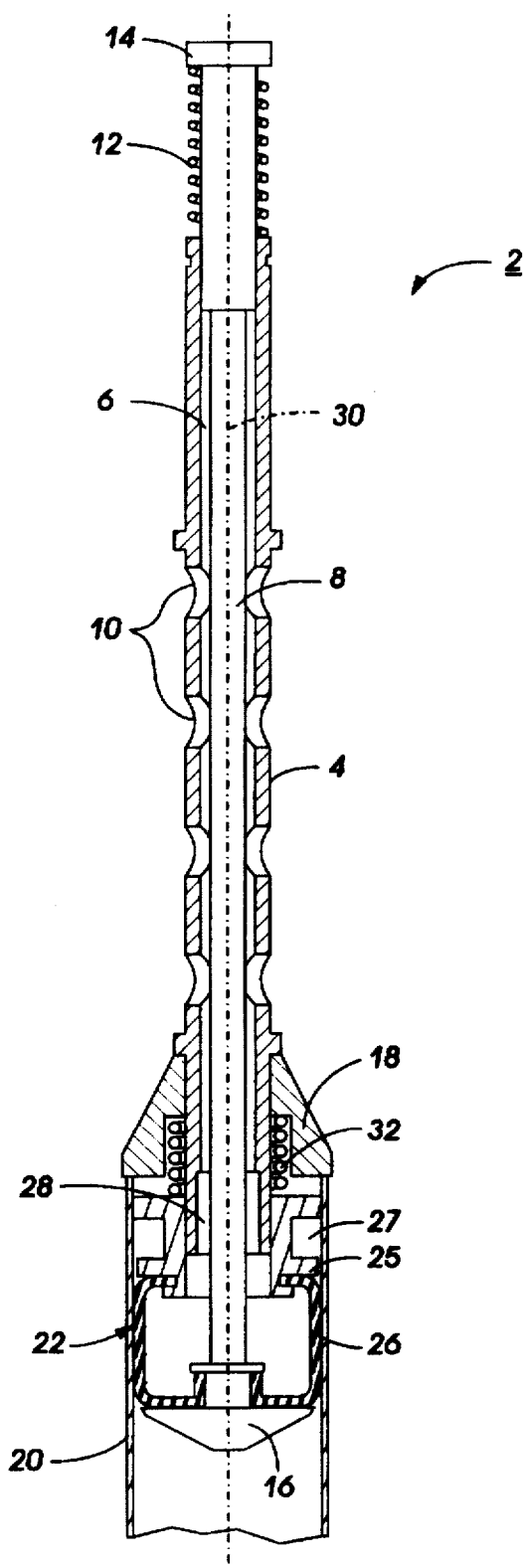
FIG. 2 represents a schematic side cross-sectional view of another embodiment of a chuck assembly.

The alternative design of the inventive chuck assembly disclosed in FIG. 2 is similar to the chuck assembly of FIG. I except the polymeric member 26 has a donut shaped configuration and a compression flange 25 replaces the wedge 24. The compression flange 25 has a recess machined in its lower section to capture the polymeric member 26. Operation of this alternative design of FIG. 2 proceeds in a similar manner to the embodiment of FIG. 1 described herein where the width changing apparatus 8 is depressed downwards via pressure on top cap 14, which moves the polymeric member 26 downwards away from the alignment shoulder 18 along the longitudinal axis 30, which stretches the polymeric member downwards, thereby decreasing the width of the polymeric member. In the present invention, the polymeric member can move along the longitudinal axis; mere stretching of the walls of the polymeric member is not considered movement for the purposes of the present invention. Thus, in embodiments, the entire polymeric member can move down and then up along the longitudinal axis. During the movement of the polymeric member downwards, the spring 32 also pushes the compression flange 25 downwards away from the alignment shoulder. When the width of the polymeric member is decreased, the end portion 22 may be inserted into the substrate 20. When the end of the substrate is close to or at the alignment shoulder, the pressure on the end cap is reduced or eliminated and the width changing apparatus 8 moves upward. Upward movement of the width changing apparatus in the direction of the alignment shoulder pushes the polymeric member against the compression flange which increases the width of the polymeric member, allows engagement of the edge of the polymeric member with the substrate inner surface, and pulls the substrate towards the alignment shoulder due to the upward movement of the polymeric member and the compression flange towards the alignment shoulder. Preferably, the engagement of the polymeric member with the substrate inner surface and the pulling up of the substrate by the upward movement of the engaged polymeric member occur substantially simultaneously. After processing of the substrate, the width changing apparatus is depressed to shrink the width of the polymeric member, thereby allowing withdrawal of the chuck assembly from the substrate.

The polymeric member in FIGS. 1–2 may be fabricated from any suitable material including for instance silicone, such as silicone rubber compound no. 88201 available from Garlock Corporation, and flexible/elastic high temperature elastomers such as VITON® and ZETPOL 2000® (hydrogenated nitrile elastomer—HNBr). The polymeric member may be coned shaped or donut shaped and may have a wall thickness ranging for example from about 1 mm to about 5 mm. There is a hole in the polymeric member to accommodate the width changing apparatus.

The other components of the chuck assembly may be fabricated from any suitable material. For example, the body and the width changing apparatus may be fabricated from a plastic or a metal like steel or aluminum. Preferably, the wedge and the compression flange are made of a plastic such as TEFLON®.

An advantage of the chuck assembly in embodiments is that it embodies low mass and therefore may not cause excessive heat flow from a thin substrate to the chuck assembly when placed in an oven.

Any other suitable chuck assemblies can be employed in the present invention such as for example Fukawa et al., U.S. Pat. No. 5,282,888; Mistrater et al., U.S. Pat. No. 5,322,300; Mistrater et al., U.S. Pat. No. 5,328,181; Mistrater et al., U.S. Pat. No. 5,320,364; and Mistrater et al., U.S. Pat. No. 5,324,049, the disclosures of which are totally incorporated herein by reference.

Figure 5:
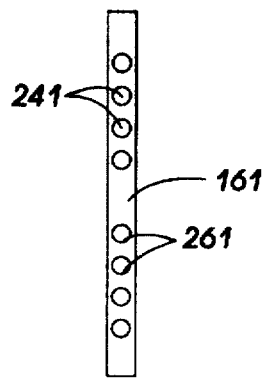
FIG. 5 represents a schematic end view of the pallet of FIG. 3.

FIGS. 3–5 illustrate one preferred embodiment of the pallet 41 where the pallet 41 defines a plurality of passageways 61 extending completely through the pallet thickness to form a first plurality of openings 81 on the top surface 91 and the bottom surface 111, wherein the pallet also defines a plurality of chambers 101 extending through at least a portion of the pallet thickness to form a second plurality of openings 121 on the bottom surface 111. In FIG. 3, the first plurality of openings 81 is shown to be the larger holes as compared with the second plurality of openings 121. The chambers 101 preferably extend completely through the pallet thickness to form a second plurality of openings 121 on the top surface 91. The number of chambers corresponds to the number of chuck assemblies, with one chamber per chuck assembly. In addition, the pallet 41 has two opposing side surfaces 141, thereby defining a pallet length, and two opposing end surfaces 161, thereby defining a pallet width, and the pallet defines a plurality of side wall openings 181 which extends through at least a portion of the pallet width, preferably through all of the pallet width, to form a plurality of pallet width channels 221. Furthermore, the pallet defines a plurality of end surface openings 241 which extends through at least a portion of the pallet length, preferably through all of the pallet length, to form a plurality of pallet length channels 261. The pallet of FIGS. 3–5 resembles a latticework having for instance rows and/or columns of the various voids (e.g., 81, 121, 181, and 241). Preferably, the chambers for the chuck assemblies are located at the interstices between the passageways. A bracket (not shown) may be coupled to each end surface to enable mounting of the pallet to a processing station such as a dip coating station or a bottom edge wipe station where the carrier system is used for example in the fabrication of photoreceptors. A frame 271 is optionally coupled to the perimeter of the pallet. The frame 271 facilitates coupling of the pallet with the processing station.

The first plurality of openings 81 and the second plurality of openings 121 occupy a substantial region of the top surface and the bottom surface of the pallet such as from about 50 to about 90%, preferably from about 60 to about 80% of the total surface area of the top and bottom surfaces. The side surface openings 181 occupy a substantial region of the surface area of the two side surfaces such as from about 40 to about 90%, preferably from about 50 to about 70% of the total surface area of the side surfaces. The end surface openings 241 occupy a substantial region of the surface area of the two end surfaces such as from about 40 to about 90%, preferably from about 50 to about 90% of the total surface area of the end surfaces. Compared with a solid pallet having no voids, the present pallet exhibits a reduction in weight ranging from about 30 to about 80%, and preferably from about 40 to about 70%. The thickness of the wall separating adjacent passageways 61 may range for example from about 1 mm to about 10 mm. The pallet may have any suitable configuration including for example a rectangular, round, or square shape. The aspect ratio may range for example from about 1 (length): 1(width) to about 5 (length): 1(width), and preferably from about 3 (length): 1(width), and especially about 3.3 (length): 1(width). The number of chambers 101 ranges for example from about 10 to about 400, preferably from about 100 to about 300 (the number of holes in the second plurality of openings 121 on the pallet bottom surface 111 equals the number of chambers 101). Regarding the number and size of the voids and their placement, the objective is to maximize the open area of the pallet while minimizing the mass. This is accomplished by determining the strength requirement of the pallet, i.e., the resistance to bending under load. This determination will result in the required cross-sectional area. The remaining area can be removed thereby resulting in the open area. The next step is to minimize the thickness of the walls defining the passageways which in turn reduces the heatup and cooldown time. Using these guidelines, a prototype pallet can be fabricated and tested to ascertain whether the desired properties are achieved. If not, changes are then made to accommodate the shortfalls.

The pallet may be a single piece and may be fabricated from a single block of material by for example machining or by casting using a mold and then machining; however, the pallet may be formed in sections which are joined together such as by welding or by the use of fasteners or an adhesive. Preferred materials for the pallet of FIGS. 3–5 may include a metal such as titanium, magnesium alloy, stainless steel, and aluminum, or a plastic. In the preferred embodiment, the fabrication process of the pallet contains specific requirements. The pallet is machined from a solid piece of aluminum (alloy 2024). The openings, passageways, and thickness are first machined to within 1 mm of the final dimensions. At this point, the resulting structure is heat treated using the following process: one cycle of heat treatment involves elevating the temperature of the pallet to 325° F. for four hours and then lowering the temperature to −125° F. for eight hours and then elevating the temperature to 325° F. for four hours. The process is then repeated five more times resulting in six cycles. The pallet is then machined to the final dimensions. The heat treatments relieve stresses which strengthen the pallet to resist bending and twisting forces even when subjected to an elevated temperature encountered in a drying oven during for instance a photoreceptor dip coating fabrication process. In operation of the carrier system, the pallet may be exposed to elevated temperatures ranging for example from about 100° to about 400° F., including temperatures ranging from about 200° to about 350° F.

Figure 6:
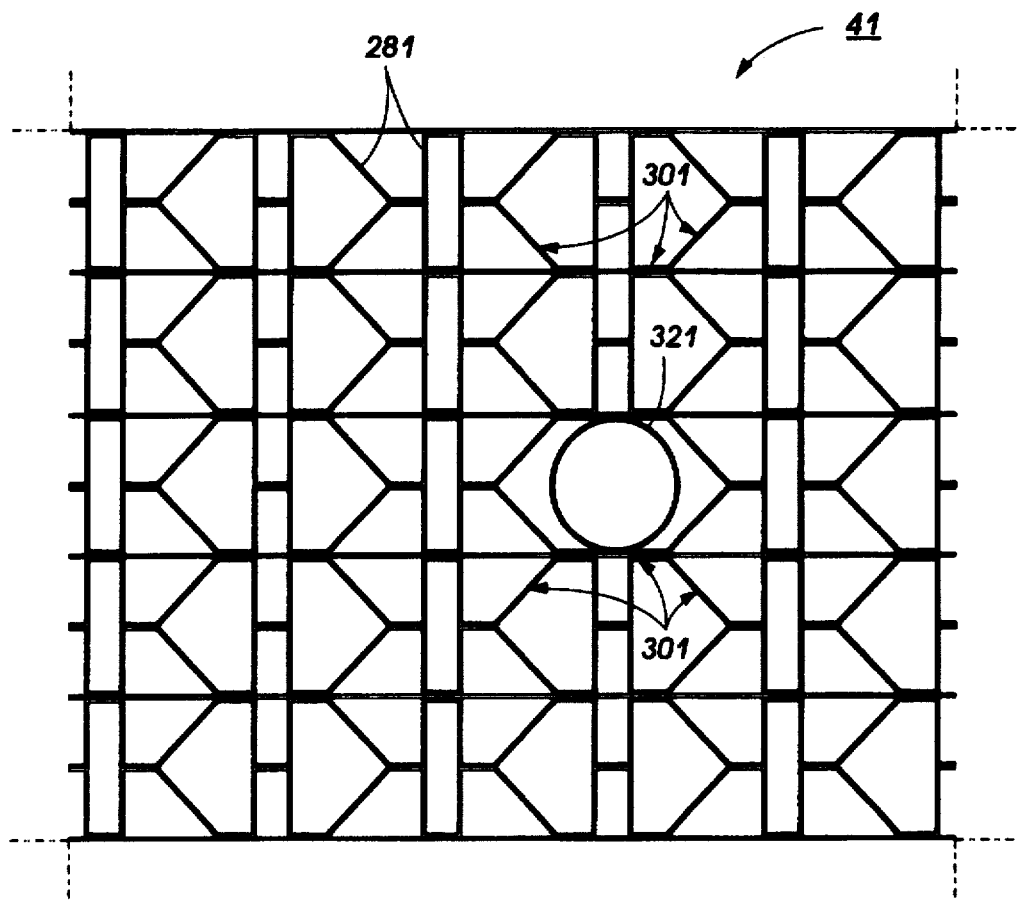
FIG. 6 represents a schematic top view of another embodiment of the pallet.

FIG. 6 illustrates another embodiment of the pallet 41 involving a honeycomb structure. This high strength honeycomb structure is made by Eldin Corporation and includes metal strips 281 welded to each other (undulating metal strips and straight metal strips). The high strength of the honeycomb structure is due at least in part to the presence of a plurality of I beams 301 formed by the metal strips. The cell wall can be as thin as 0.005 inch which provides a low weight. The honeycomb structure is fabricated from for example stainless steel and spot welded together. The chambers for the chuck assemblies can be machined using for example electrodischarge machining. A plurality of sleeve members 321, one sleeve member for each chuck assembly, is then furnace brazed into the chambers for strength and positional accuracy. The entire pallet containing the sleeve members can then be furnace brazed for enhanced rigidity. Unless otherwise noted, the description herein for the embodiment illustrated in FIGS. 3–5 is applicable for the embodiment of FIG. 6.

The pallet of the present invention has one or more of the following characteristics: lightweight for minimal heat sinking; strong and rigid for precise positioning of the coupled substrate batch in a processing station and repeatability of the precise positioning of the substrate batch; open structure for improved air flow through the pallet which is important when there is a need for rapid cooling or heating of the substrate batch; clean room compatibility (i.e., must not contaminate the coatings on the substrate batch); and high temperature dimensional stability. In embodiments of the present invention, the inventive carrier system has all of the above characteristics.

A plurality of the chuck assemblies of the types illustrated for instance herein may be coupled to the pallet by the following preferred method: dimensioning the chambers such that each chuck assembly is slip fitted into a chamber and employing a retaining ring at the top of the chuck assembly. Other suitable techniques can be used to couple the chuck assemblies to the pallet. The number of chuck assemblies ranges for example from about 10 to about 400, preferably from about 100 to about 300.

Figure 7:
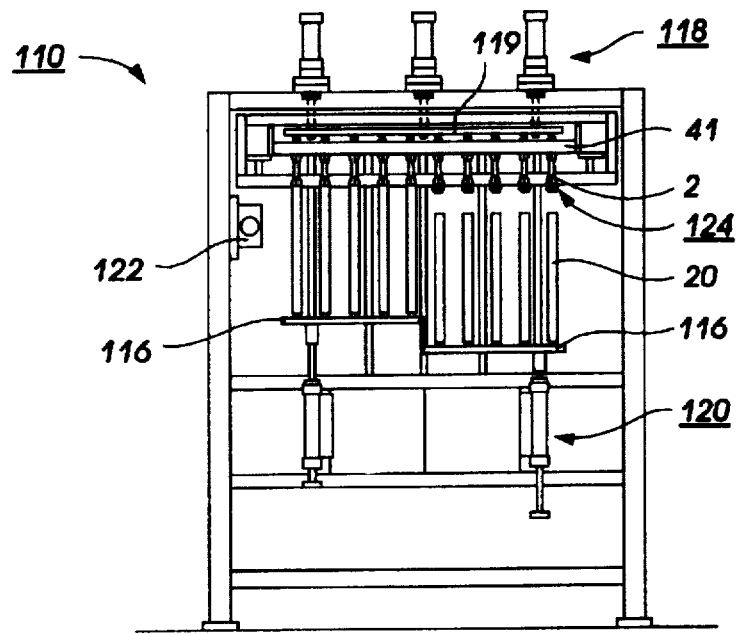
FIG. 7 represents a schematic front view showing a substrate load/unload station having the present carrier system.
Figure 8:
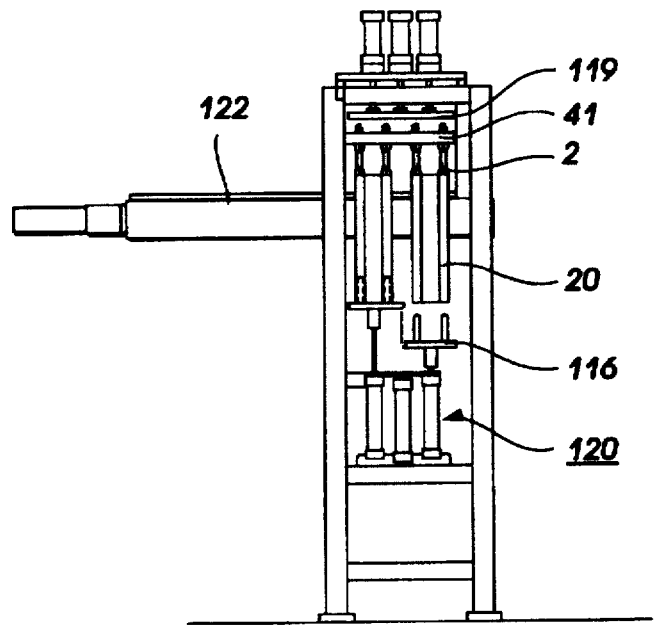
FIG. 8 represents a schematic side view of the substrate load/unload station of FIG. 7.

The present carrier system 124 may be part of a load/unload station 110 as described in FIGS. 7 and 8. The present carrier system 124 is described in the context of a dip coating process system, but the carrier system can be employed in other manufacturing processes. Initially, the substrates 20 to be dip coated are placed onto a load pallet 116. The load pallet 116 includes a plurality of demarcated positions designed to receive the substrates in a configuration which dimensionally corresponds with a pallet 41 positioned subjacent to the load pallet 116. The pallet 41 includes a plurality of chuck assemblies 2, each chuck assembly receiving a single substrate 20 thereon. The load/unload station 110 also includes a chuck engage/disengage apparatus 118 and a load pallet vertical lift 120 which cooperate with the pallet 41. The chuck engage/disengage apparatus 118 includes a contact plate 119 for pressing against the top of each chuck assembly 2 to simultaneously actuate each chuck assembly. Thus, the chuck engage/disengage apparatus 118 and the load pallet vertical lift 120 operate interactively with the substrates 20, to raise and load the substrates, onto the pallet, as well as to lower and unload the finished substrates from the pallet 41. This load/unload operation is diagrammatically illustrated in FIGS. 7 and 8 by the contrasting offset positions of halves of the load pallet 116. Finally, the pallet load/unload station 110 also includes a carrier pallet horizontal transport 122 for transporting and transferring a loaded pallet from the load/unload station 110 to the dip coating cell (not shown). The present carrier system may be employed in the dip coat process material handling system described in Pietrzykowski, Jr. et al., U.S. Pat. No. 5,334,246, the disclosure of which is totally incorporated herein by reference.

Any suitable rigid or flexible substrate may be held by the present chuck assembly. The substrate may have a cylindrical cross-sectional shape or a noncylindrical cross-sectional shape such as an oval shape. The substrate may be at least partially hollow, and preferably entirely hollow, with one or both ends being open. In preferred embodiments, the substrate is involved in the fabrication of photoreceptors and may be bare or coated with layers such as photosensitive layers typically found in photoreceptors. The substrate may have any suitable dimensions.

Other modifications of the present invention may occur to those skilled in the art based upon a reading of the present disclosure and these modifications are intended to be included within the scope of the present invention.

We claim:

1. A carrier system for carrying a substrate batch comprising:
    (a) a heat treated, integral pallet having a pallet thickness, a top surface, and a bottom surface, wherein the pallet defines a plurality of passageways extending completely through the pallet thickness to form a first plurality of openings on the top surface and the bottom surface, wherein the pallet also defines a plurality of chambers extending through at least a portion of the pallet thickness to form a second plurality of openings on the bottom surface; and
    (b) a plurality of chuck assemblies partially disposed in the plurality of the chambers and adapted to engage the substrate batch, wherein the pallet has sufficient structural rigidity such that while the carrier system is carrying the substrate batch, even when the carrier system is subjected to an elevated temperature, there is absent any appreciable bending and twisting of the pallet.

2. The carrier system of claim 1, wherein the pallet is a single piece.

3. The carrier system of claim 1, wherein the pallet has two opposing side surfaces, thereby defining a pallet length, and two opposing end surfaces, thereby defining a pallet width, and the pallet defines a plurality of side wall openings which extends through at least a portion of the pallet width to form a plurality of pallet width channels.

4. The carrier system of claim 3, wherein the pallet defines a plurality of end surface openings which extends through at least a portion of the pallet length to form a plurality of pallet length channels.

5. The carrier system of claim 1, wherein the pallet is heat treated a plurality of times during fabrication.

6. The carrier system of claim 1, wherein the plurality of the chuck assemblies ranges from about 10 to about 400.

7. The carrier system of claim 1, wherein the plurality of the chuck assemblies ranges from about 100 to about 300.

8. The carrier system of claim 1, wherein the pallet comprises undulating metal strips welded together.

9. The carrier system of claim 1, wherein the pallet includes a sleeve member in each of the plurality of the chambers.

10. The carrier system of claim 1, wherein the pallet comprises a plurality of I beams.

11. The carrier system of claim 1, wherein the plurality of chambers extends completely through the pallet thickness to form a second plurality of openings on the top surface.

* * * * *